United States Patent
Hu et al.

(10) Patent No.: US 9,930,793 B2
(45) Date of Patent: Mar. 27, 2018

(54) ELECTRIC CIRCUIT ON FLEXIBLE SUBSTRATE

(71) Applicant: Intel Corporation, Santa Clara, CA (US)

(72) Inventors: Chuan Hu, Chandler, AZ (US); Siddarth Kumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 14/227,779

(22) Filed: Mar. 27, 2014

(65) Prior Publication Data
US 2015/0282341 A1  Oct. 1, 2015

(51) Int. Cl.
*H05K 5/00* (2006.01)
*H01L 21/56* (2006.01)
(Continued)

(52) U.S. Cl.
CPC .......... *H05K 5/0095* (2013.01); *H01L 21/56* (2013.01); *H05K 1/0326* (2013.01);
(Continued)

(58) Field of Classification Search
CPC . H01L 2224/48091; H01L 2924/00014; H01L 21/56; H01L 2224/16225; H01L 2224/73265; H01L 23/3135; H05K 1/0326; H05K 1/0393; H05K 1/115; H05K 1/181; H05K 2201/0195; H05K 3/303; H05K 5/0095; H05K 5/065; Y10T 29/49146
See application file for complete search history.

(56) References Cited

U.S. PATENT DOCUMENTS 5,578,869 A * 11/1996 Hoffman ............... H01L 23/057
  257/691
6,888,172 B2 * 5/2005 Ghosh ................. H01L 51/5253
  257/100
(Continued)

FOREIGN PATENT DOCUMENTS

CN   102687598 A   9/2012
CN   104952741 A   9/2015
(Continued)

OTHER PUBLICATIONS

"Anodic Bonding using Evaporated Borosilicate Glass Thin-Films", WaferBond Conference, Retrieved from the Internet: URL:http://www.lithoglas.de/waferbond13.html, (2013).
(Continued)

*Primary Examiner* — Nathan Milakovich
(74) *Attorney, Agent, or Firm* — Schwegman Lundberg & Woessner, P.A.

(57) ABSTRACT

Generally discussed herein are systems and apparatuses that can include a flexible substrate with a hermetic seal formed thereon. The disclosure also includes techniques of making and using the systems and apparatuses. According to an example a technique of making a hermetic seal on a flexible substrate can include (1) forming an interconnect on a flexible substrate, (2) situating a device on the substrate near the interconnect, or (3) selectively depositing a first hermetic material on the device or interconnect so as to hermetically seal the device within the combination of the interconnect and first hermetic material.

5 Claims, 8 Drawing Sheets

(51) Int. Cl.
  *H05K 1/18* (2006.01)
  *H05K 1/03* (2006.01)
  *H05K 5/06* (2006.01)
  *H05K 1/11* (2006.01)
  *H05K 3/30* (2006.01)
  *H01L 23/31* (2006.01)

(52) U.S. Cl.
  CPC .......... *H05K 1/0393* (2013.01); *H05K 1/115* (2013.01); *H05K 1/181* (2013.01); *H05K 3/303* (2013.01); *H05K 5/065* (2013.01); *H01L 23/3135* (2013.01); *H01L 2224/16225* (2013.01); *H01L 2224/48091* (2013.01); *H01L 2224/73265* (2013.01); *H05K 2201/0195* (2013.01); *Y10T 29/49146* (2015.01)

(56) References Cited

U.S. PATENT DOCUMENTS

| | | | | |
|---|---|---|---|---|
| 7,268,486 | B2* | 9/2007 | Ottermann | C03B 19/00 257/E21.275 |
| 7,358,106 | B2* | 4/2008 | Potter | B81C 1/00269 257/710 |
| 7,535,017 | B2* | 5/2009 | Wittmann | H01L 51/0097 257/40 |
| 8,104,356 | B2* | 1/2012 | Lu | G01L 19/141 73/715 |
| 8,115,326 | B2* | 2/2012 | Aitken | C23C 14/10 257/701 |
| 2004/0197489 | A1* | 10/2004 | Heuser | B32B 27/00 427/535 |
| 2007/0152148 | A1* | 7/2007 | Chao | H01L 27/14618 250/239 |
| 2009/0121333 | A1 | 5/2009 | Aitken et al. | |
| 2010/0164030 | A1* | 7/2010 | Oggioni | H01L 23/145 257/432 |
| 2011/0175487 | A1 | 7/2011 | Hansen et al. | |
| 2012/0224264 | A1 | 9/2012 | Chiba et al. | |
| 2013/0256900 | A1 | 10/2013 | Mcconnelee et al. | |
| 2013/0307145 | A1* | 11/2013 | Chung | H01L 23/49811 257/737 |
| 2014/0185264 | A1* | 7/2014 | Chen | H01L 23/3128 361/814 |
| 2014/0291866 | A1* | 10/2014 | Ooi | H01L 23/498 257/777 |

FOREIGN PATENT DOCUMENTS

| | | |
|---|---|---|
| JP | 02153543 A | 6/1990 |
| JP | 2153543 A | 6/1990 |
| JP | 05183000 A | 7/1993 |
| JP | 07231120 A | 8/1995 |
| JP | 2000023756 A | 1/2000 |
| JP | 2005136384 A | 5/2005 |
| JP | 2007035739 A | 2/2007 |
| JP | 2009004650 A | 1/2009 |
| JP | 2010086994 A | 4/2010 |
| JP | 2011174762 A | 9/2011 |
| JP | 2012181480 A | 9/2012 |
| JP | 2012227290 A | 11/2012 |
| JP | 2013085006 A | 5/2013 |
| JP | 2013243345 A | 12/2013 |
| JP | 2015192144 A | 11/2015 |
| KR | 20130061141 A | 6/2013 |
| WO | WO-9630942 A1 | 10/1996 |

OTHER PUBLICATIONS

"European Application Serial No. 15155294.0, Extended European Search Report dated Sep. 21, 2015", 7 pgs.

Kumar, Siddarth, "Design and Fabrication of an Optical Pressure Micro Sensor for Skin Mechanics Studies", (Jun. 2006), 90 pgs.

Kumar, Siddarth, et al., "Flexible Membrane Tactile Sensor for Contact Traction Distribution Measurement on a Microscale", IEEE World Haptics Conference 2011, (2011), 6 pgs.

Liu, Chao-Xuan, "Patterning conductive PDMS nanocomposite in an elastomer using microcontact printing", (Jul. 14, 2009), 8 pgs.

"European Application Serial No. 15155294.0, Response filed Apr. 21, 2016 to Extended European Search Report dated Sep. 21, 2015", 9 pgs.

"Japanese Application Serial No. 2015-023841, Office Action dated Mar. 22, 2016", w/ English Translation, 5 pgs.

"Japanese Application Serial No. 2015-023841, Examiners Decision of Final Refusal dated Oct. 18, 2016", W/ English Translation, 5 pgs.

"Japanese Application Serial No. 2015-023841, Response filed May 27, 2016 to Office Action dated Mar. 22, 2016", W/ English Translation of Claims, 17 pgs.

"Chinese Application Serial No. 201510090404.9, Office Action dated Apr. 1, 2017", w/o English Translation, 8 pgs.

"European Application Serial No. 15155294.0, Communication Pursuant to Article 94(3) EPC dated Dec. 14, 2016", 4 pgs.

"European Application Serial No. 15155294.0, Response filed Apr. 24, 2017 to Communication Pursuant to Article 94(3) EPC dated Dec. 14, 2016", 8 pgs.

"Korean Application Serial No. 2015-0026890, Office Action dated Dec. 5, 2016", w/ English Translation, 14 pgs.

\* cited by examiner

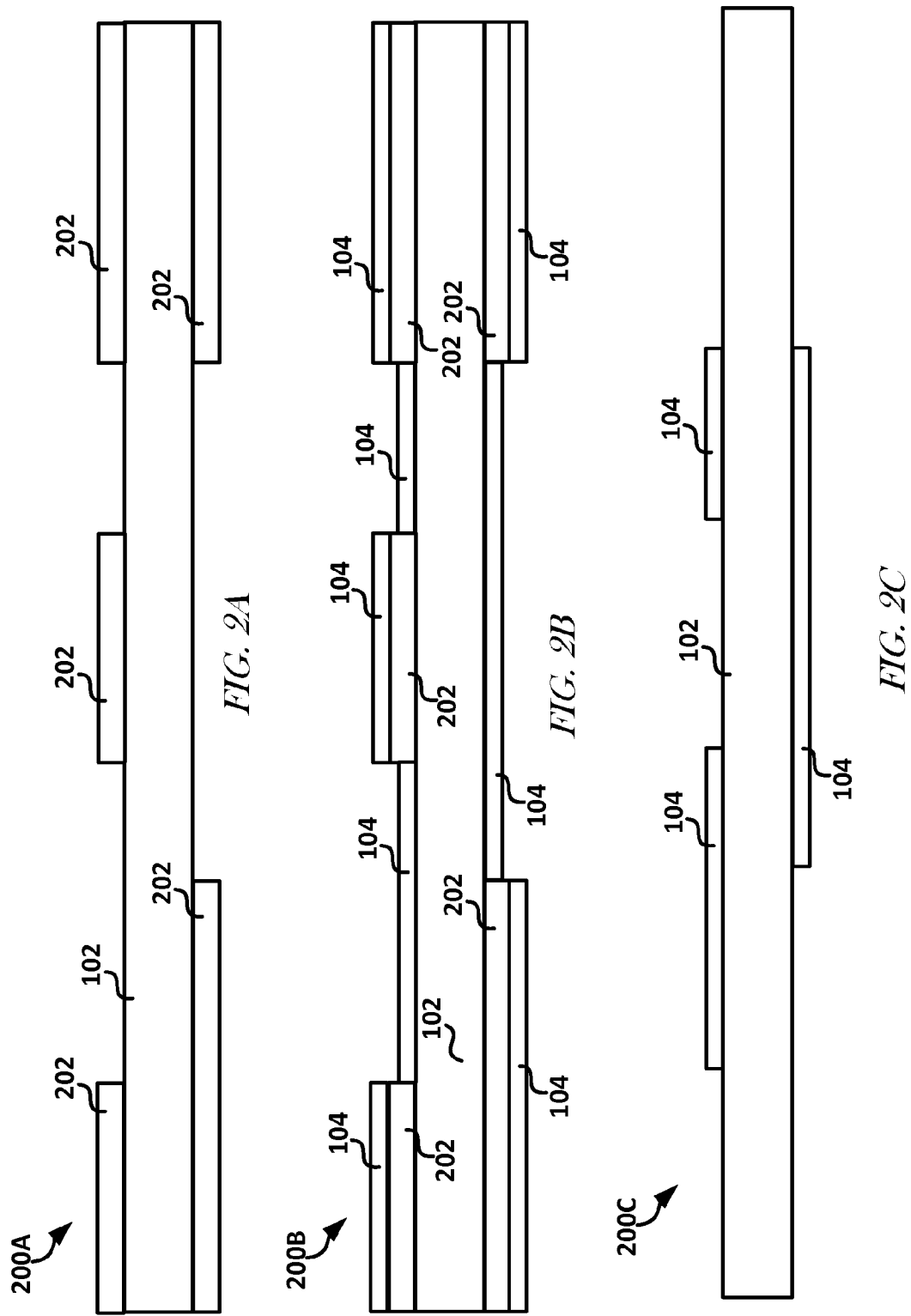

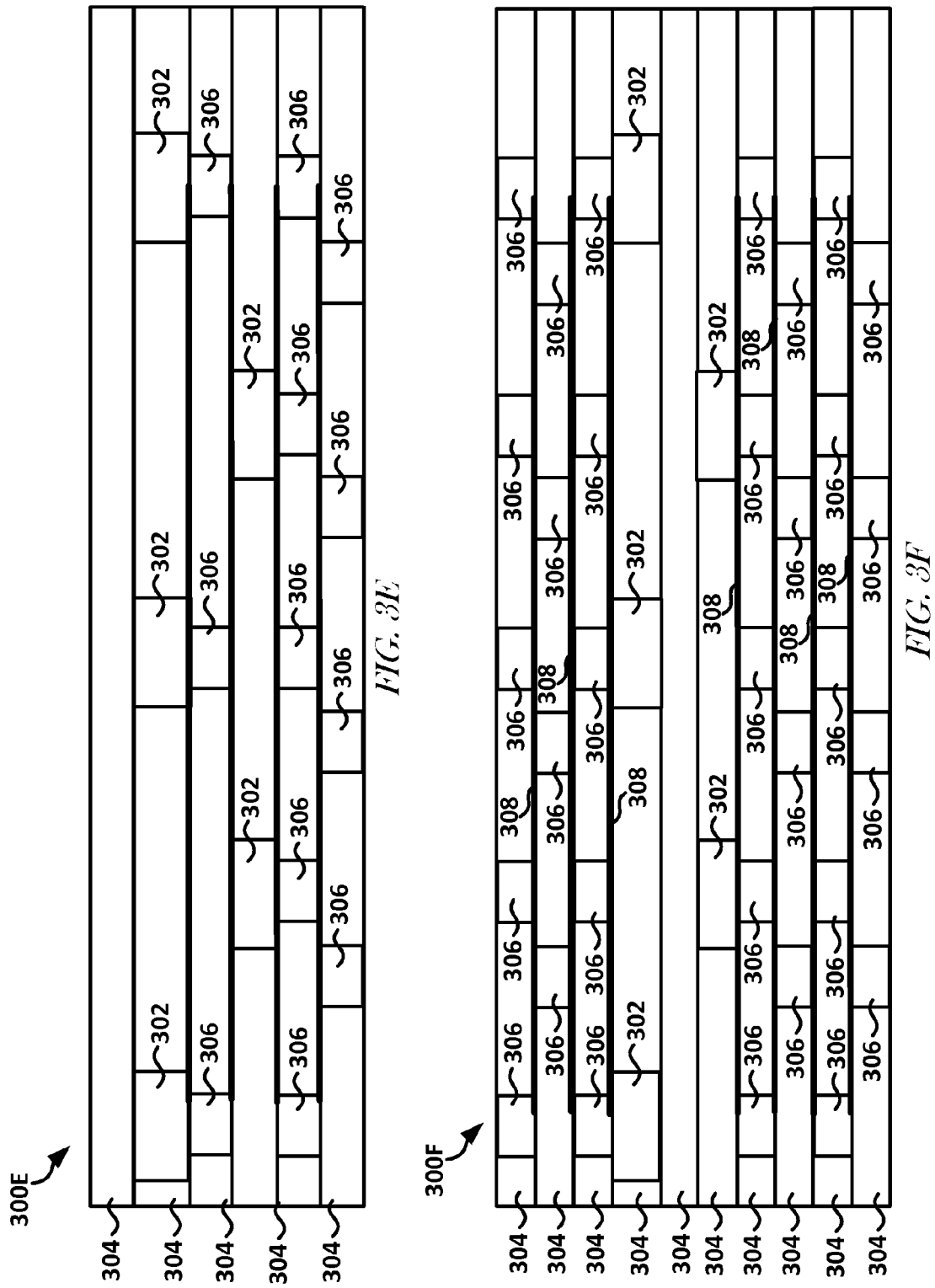

ELECTRIC CIRCUIT ON FLEXIBLE SUBSTRATE

TECHNICAL FIELD

Examples generally relate to flexible circuit architectures and methods. Some examples relate to a hermetic seal in a flexible circuit architecture.

TECHNICAL BACKGROUND

Current mobile devices (beyond mobile phones and tablets) are termed as "internet of things" (i.e. the internetworking of things). The internet of things includes wearables that can include small, low power silicon integrated into unique form factors (e.g., flexible fitness bands, smart watches, smart eye wear, etc.). As the product category of wearables continues to evolve, new devices will emerge with other unique form factors and use conditions.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2A, 2B, 2C, 2D, 2E, and 2F show block diagrams of an example of a technique for making a flexible device with a hermetic seal.

FIGS. 3A, 3B, 3C, 3D, 3E, and 3F show block diagrams of examples of flexible device architectures.

DESCRIPTION OF EMBODIMENTS

Figure 1:
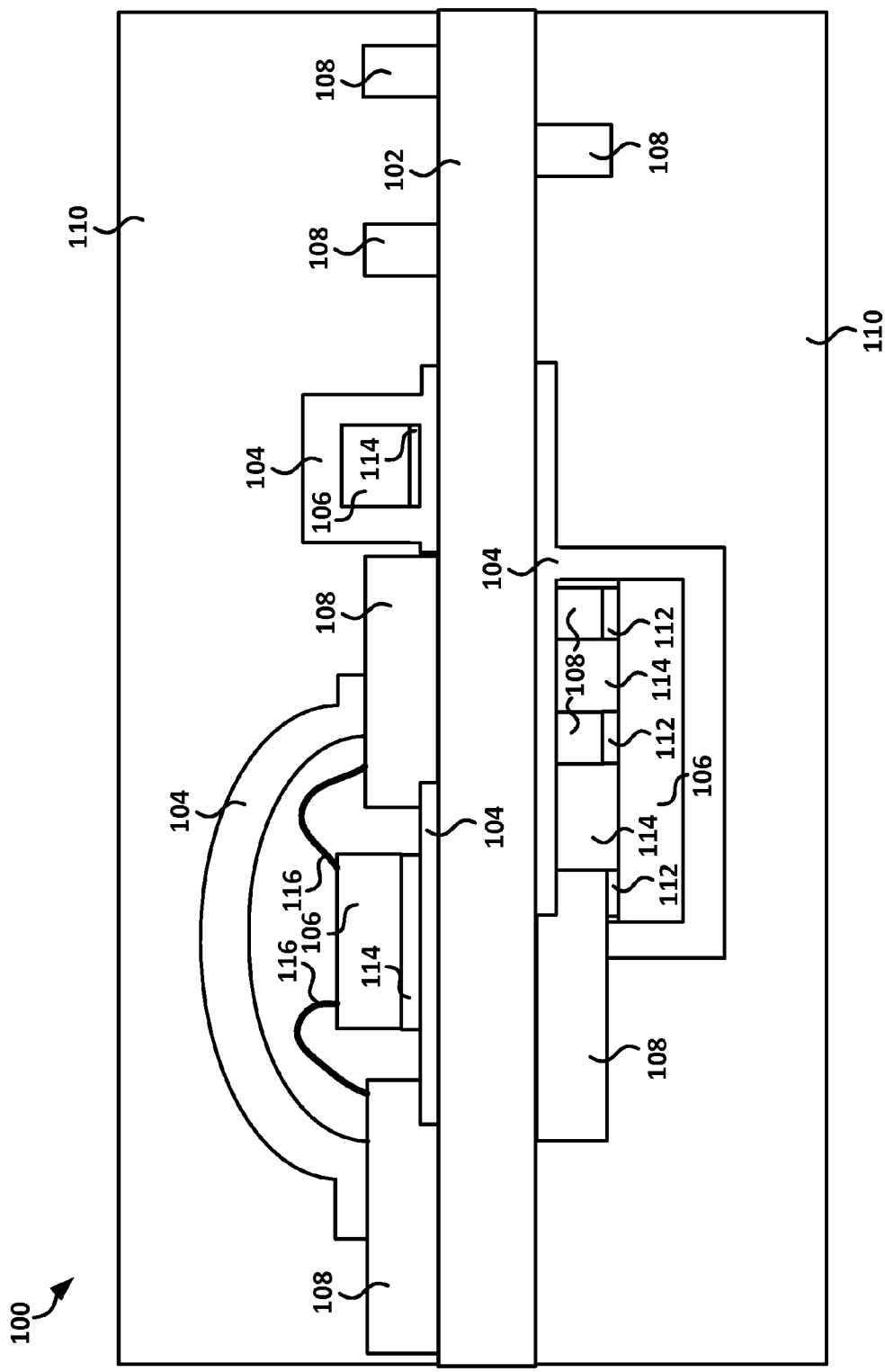
FIG. 1 shows a block diagram of an example of a flexible device with a hermetic seal.

Examples in this disclosure relate generally to flexible (e.g., stretchable or bendable) circuit architectures and techniques. More specifically, examples relate to forming a seal (e.g., a hermetic (i.e. airtight) seal) on a flexible circuit.

Flexible electronics can help provide unique circuit architectures (e.g., form factors). Stretchable electronics have the potential to help enable die or other component integration into/onto fabrics, compliant plastics, polymers, or even on skin, such as in the form of a tattoo or sticker, such as for sensing and computing applications. A traditional rigid System on Chip (SoC), such as those currently used in mobile phones, tablets or watches, among others, generally consist of a silicon die on a rigid substrate that is mounted on a rigid package. The traditional SoCs may not be suitable for use in a situation that calls for a flexible circuit or a unique (e.g., bendable or stretchable) form factor.

With the introduction of wearable or flexible devices, components in/on the devices can benefit from an improved hermeticity, such as to enhance performance or reliability by protecting the components from the surrounding environment. However, the flexible materials are typically Poly-DiMethylSiloxane (PDMS), PolyEthylene Terepthalate (PET), or Polyimide (PI), which are not hermetic materials. Materials that are hermetic, such as glass, metal, ceramic, some dielectric, or other hermetic materials, are typically less flexible than the flexible materials and can be brittle.

One solution to providing a hermeticity includes using a glass sealant, such as that used in an Organic Light Emitting Diode (OLED). This glass has a fairly limited bendability and is virtually unstretchable. The glass used in an OLED is also rather thick (i.e. around one hundred micrometers thick or thicker). In addition, current LED hermetic seals are generally formed using injection molding and the hermetic seal is not formed on a flexible substrate. By providing the ability to form a hermetic seal on a flexible substrate, a variety of hermetic seal designs can be used and the design of a flexible circuit is not limited to off the shelf hermetically sealed components. In addition, the hermitic seal discussed herein can be formed, at least partially, after the component has been electrically or mechanically connected to the circuit it is to be used in. Hermetic seals are typically formed prior to connecting a hermetically sealed component to a circuit.

A solution to providing hermeticity, while not significantly reducing the flexibility of a device, can include providing an island of hermetic material, such as an island sized and shaped for a component (e.g., an electric or electronic device, such as a resistor, capacitor, transistor, inductor, radio, memory, processor, laser, LED, sensor, or other digital or analog component). The island can have a variety of different form factors, such as by using a photoresist compatible method to form the island. Such as solution can allow an apparatus to remain flexible while providing hermetic protection for a component of the apparatus. A specified combination of hermeticity and flexibility can be achieved by including the hermetic island on a flexible (e.g., non-hermetic (i.e. not airtight)) substrate.

The hermetic sealing can be accomplished at a low temperature, such as to broaden the material choices for the flexible substrate or components used in the fabrication of the apparatus. At about one hundred degrees Celsius (a low temperature), hermetic material deposition (e.g., selective glass deposition) can be accomplished, such as by using a sputtering technique. The low temperature deposited hermetic material can be patterned with photoresist, such that after the photo resist is removed, the hermetic material is selectively deposited on only specified areas of the substrate.

The hermetic material can be sputtered on a trace, pad, or other metallic (e.g., Copper (Cu), Gold (Au), Silver (Ag), Aluminum (Al), or other metal) interconnect. An adhesion strength between the hermetic material and a surface that the hermetic material is deposited on can be increased by bombarding the surface with ions before or during the hermetic material deposition.

An island of hermetic material can be small enough such that the main elastic or plastic loading can happen outside the island of hermetic material, and the device can retain a majority (nearly all) of its flexibility. Also, the thickness of the hermetic material can be between about one micron and ten microns (or less), such as to help the device retain a slim profile.

FIG. 1 shows a block diagram of an example of a flexible apparatus 100. The flexible apparatus 100 can include a substrate 102 with hermetic material 104 thereon. The hermetic material 104 can be a material with a structure sufficient to form a hermetic (i.e. airtight) seal. The hermetic material 104 can help provide a hermetic seal for one or more components 106. The apparatus 100 can include a conductive interconnect 108, such as a trace, pad, via, or the like. The apparatus 100 can include a dielectric 110 (e.g., passivation material). The apparatus 100 can include a dielectric (e.g., a buildup material or adhesive) 114.

The substrate 102 can provide a medium on which a flexible circuit can be built. The substrate 102 can include a flexible material, such as PDMS, PET, PI, a thermoplastic elastomer, or other flexible material.

The hermetic material 104 can help provide a hermetic seal, such as to protect at least a portion of a component 106 from the surrounding environment. The hermetic material 104 can be of varying thicknesses, such as to fit the needs of a component or apparatus. A thicker hermetic material can help provide more protection for a component at the expense of space and cost, while a thinner hermetic material may not provide as robust a protection as a thicker hermetic material, but saves in cost and space. The hermetic material 104 can include a thickness of between about one and one hundred micrometers thick. In one or more embodiments, the thickness of the hermetic material 104 can be between about one tenth of a micrometer and ten micrometers or less than ten micrometers. In one or more embodiments, the thickness of the hermetic material 104 can be between about one and two micrometers. The hermetic material 104 can be sputtered on the substrate 102, component 106, interconnect 108, or other item of the apparatus 100, such as at a low temperature (e.g., about one hundred degrees Celsius or less). In one or more embodiments, such as when the flexible substrate includes PI, the temperature can be higher, such as up to about two hundred fifty degrees Celsius.

The component 106 can be an electric or electrical component, such as a packaged component (e.g., a Surface Mount (SMT), Flip Chip (FC), Ball Grid Array (BGA), Land Grid Array (LGA), Bumpless Buildup Layer (BBUL), or other package) or an unpackaged component. The component 106 can include a transistor, resistor, die (e.g., processor, memory, radio, or other analog or digital circuitry), a capacitor, a Light Emitting Diode (LED), an inductor, a memory gate, combinational or state logic, or other electric or electronic component.

The interconnect 108 can include a trace, pad, male or female connection feature, via, or other conductive interconnect. The interconnect 108 can include a metal, such as Cu, Ag, Au, or other conductive metal. The interconnect 108 can be coupled to one or more of the components 106 through a wire 116 or solder 112 connection. The interconnect 108 can be insulated or separated from another interconnect or component 106 by a dielectric 114 or 110.

The dielectric 110 can provide protection for the items of the apparatus 100, such as from the environment around the apparatus 100. The dielectric 110 can include PDMS, rubber, or a dielectric material. The dielectric 114 can include a material with a sufficiently low dielectric constant, loss tangent, or bond strength, such as Liquid Crystal Polymer (LCP), PI, PDMS, or an acrylic, among others. The dielectric 114 can include an additive, such as to help enhance the performance of the material.

The solder 112 can electrically or mechanically couple one or more interconnects 108 or one or more components 106. The solder 112 can include tin, lead, zinc, silver, aluminum, bismuth, or Anisotropic Conductive Film (ACF), among others.

The dielectric 114 can be similar to the dielectric 110 and can include materials similar to those of the dielectric 110.

Figure 2D:
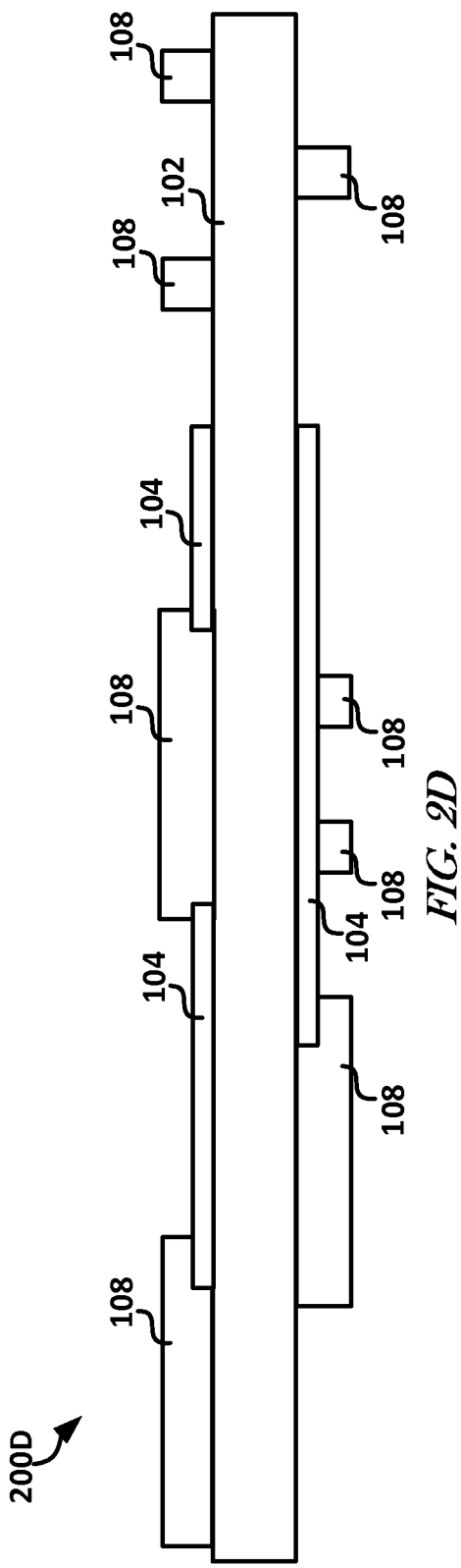

FIGS. 2A, 2B, 2C, 2D, 2E, and 2F, each show a stage of an example of a technique for making a flexible substrate with a hermetic island. FIG. 2A shows a block diagram of an example of an apparatus 200A that can include a substrate 102 with photoresist 202 patterned thereon. The photoresist 202 can be deposited to protect the underlying substrate 102 from hermetic material deposition. The locations with photoresist 202 can be locations which hermetic material is not to be situated. Photoresist 202 can be situated through a lithography, stencil printing, or screen printing process. Stencil or screen printing can be more cost effective than lithography.

FIG. 2B shows a block diagram of an example of an apparatus 200B. The apparatus 200B can be similar to the apparatus 200A with a layer of hermetic material 104 deposited on the substrate 102 and the photoresist 202. The hermetic material 104 can be greater than one micrometer thick, such as to help prevent effects from microcracks in the hermetic material 104. The hermetic material 104 can help provide hermeticity for a device situated on the hermetic material 104. The hermetic island can provide hermeticity for a side of a component that faces the substrate 102. The hermetic material 104 can be deposited at a temperature that is less than about one hundred degrees Celsius.

FIG. 2C shows a block diagram of an example of an apparatus 200C. The apparatus 200C can be similar to the apparatus 200B with the photoresist 202, and the hermetic material 104 on the photoresist 202 removed therefrom. The photoresist 202 can be chemically removed, such as by dissolving the photoresist 202, or the photoresist 202 can be mechanically removed, such as by peeling the photoresist 202, such as with an assistance from sonic energy.

FIG. 2D shows a block diagram of an example of an apparatus 2000D. The apparatus 200D can be similar to the apparatus 200C with one or more interconnects 108 situated at least partially on the substrate 102 or at least partially on the hermetic material 104.

Figure 2E:
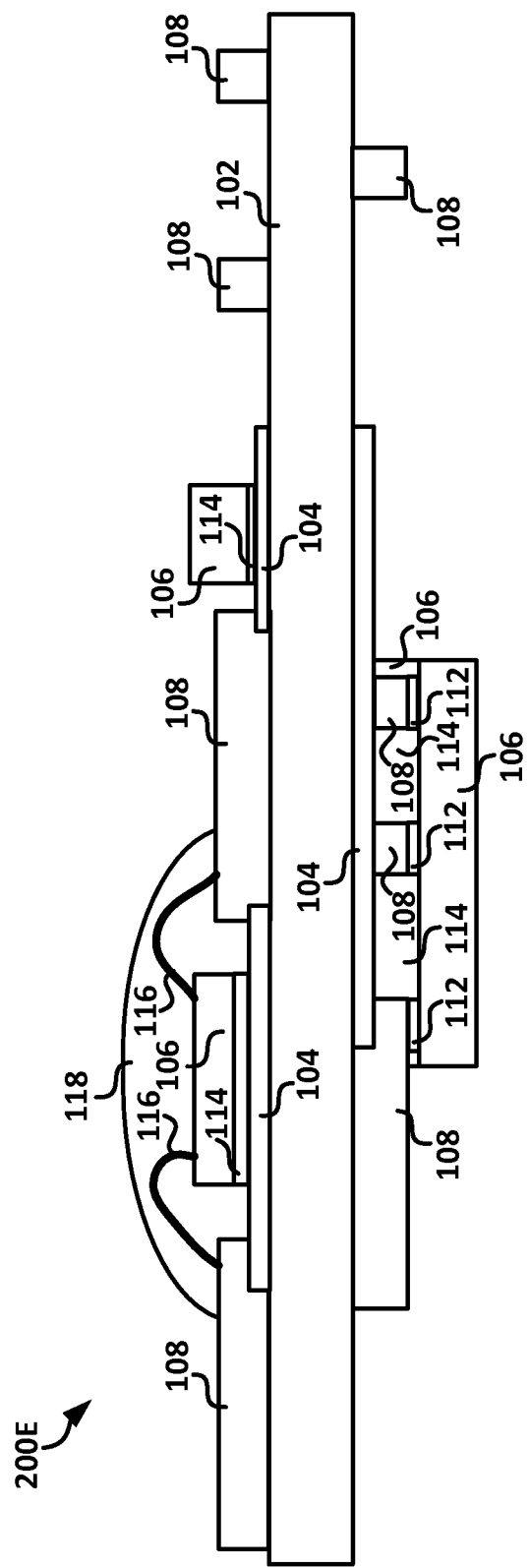

FIG. 2E shows a block diagram of an example of an apparatus 200E. The apparatus 200E can be similar to the apparatus 200D with one or more components 106 situated or built on the substrate 102, such as at least partially on the hermetic material 104 or the interconnect 108. A dielectric 114 can be situated on the hermetic material 104, such as between the interconnect 108. The component 106 can be situated on or adhered to the dielectric 114. The component 106 can be electrically or mechanically coupled to the interconnect 108, such as by soldering or wire bonding. The component 106, wire 116, dielectric 114, interconnect 108, or hermetic material 104, can be at least partially surrounded by a molding material 118.

Figure 2F:
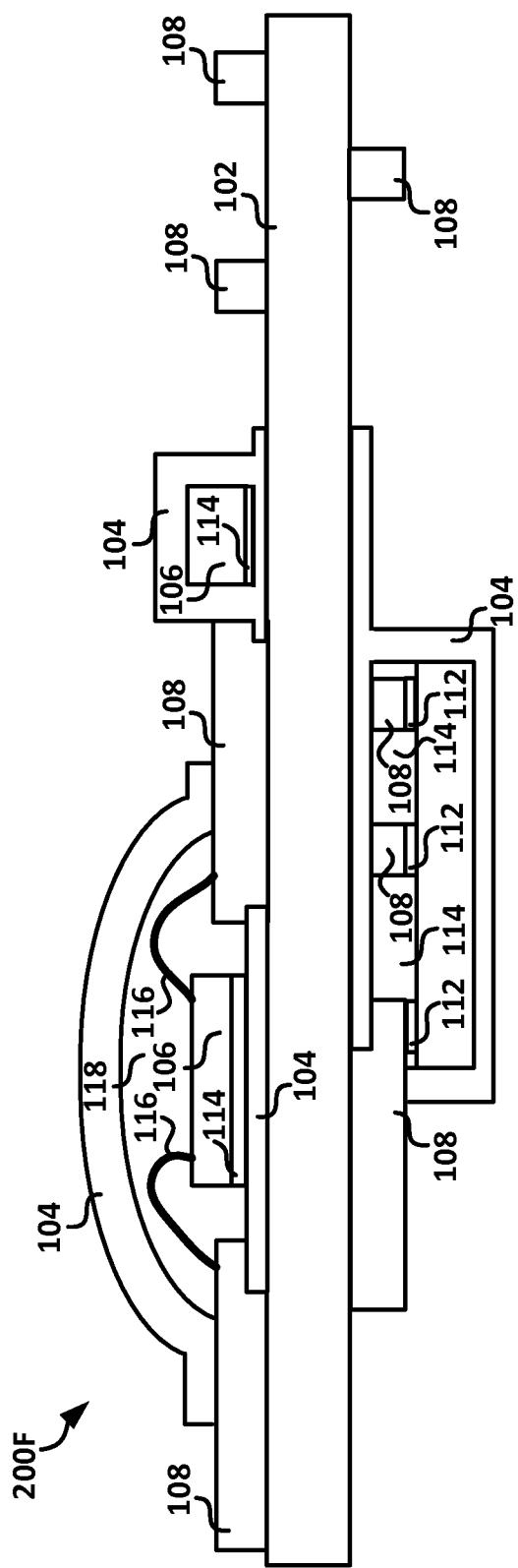

FIG. 2F shows a block diagram of an example of an apparatus 200F. The apparatus 200F can be similar to the apparatus 200E with hermetic material 104 selectively situated (e.g., deposited) on the apparatus 200E. The hermetic material 104 can be deposited so as to combine with hermetic material that was previously deposited on the substrate 102. Selectively depositing the hermetic material 104 can include situating photoresist on the apparatus (e.g., lithographically, screen printing, or stenciling photoresist on the apparatus). Moisture or other contaminants can be removed from the apparatus before the hermetic material 104 is deposited thereon. Removing moisture or other contaminants can include baking, blowing, or dry cleaning the apparatus. The hermetic material 104 can be deposited (e.g., sputtered) on the apparatus (e.g., the baked or cleaned apparatus). The hermetic material that is on the photoresist and the photoresist can be removed, such as by chemically or mechanically removing the photoresist. The hermetic material 104 can be deposited on the component 106, interconnect 108, substrate 102, other hermetic material, the dielectric 114, or the molding material 118. To improve an adhesion between the hermetic material 104 and the item the hermetic material is situated on (e.g., the interconnect 108, component 106, substrate 102, other hermetic material, dielectric, or other item of the apparatus 100), ions can be bombarded onto the apparatus (e.g., the item the hermetic material is to be situated on), such before or during hermetic material deposition.

A dielectric 110 can be formed on the apparatus 200F, such as to form the apparatus 100 of FIG. 1. The dielectric 110 can provide a passivation or cosmetic protection for the items of the apparatus. The dielectric 110 can be flexible or can include the same or similar material as the substrate 102. Another layer of electronics can be formed, such as by creating an opening or building another circuit, such as by following the technique as described with regard to FIGS. 2A-2F or FIG. 1. Layers of electronics can be electrically or mechanically coupled by forming a hole in the dielectric FIGS. 3A, 3B, 3C, 3D, 3E, and 3F each show a block diagram of a flexible electronic circuit according to one or more embodiments. Traditional System on Chip (SoC) packages are rigid and include a die mounted on a rigid polymer substrate. These packages are usually mounted on a rigid motherboard for a mobile phone, tablet, or other device. Traditional packages are not usually mounted on flexible surfaces such as fabrics, compliant plastics, polymers, or even skin. FIGS. 3A-3F show flexible (e.g., stretchable) multilayer circuits that can include one or more silicon dies or die sections mounted thereon or therein.

Figure 3A:
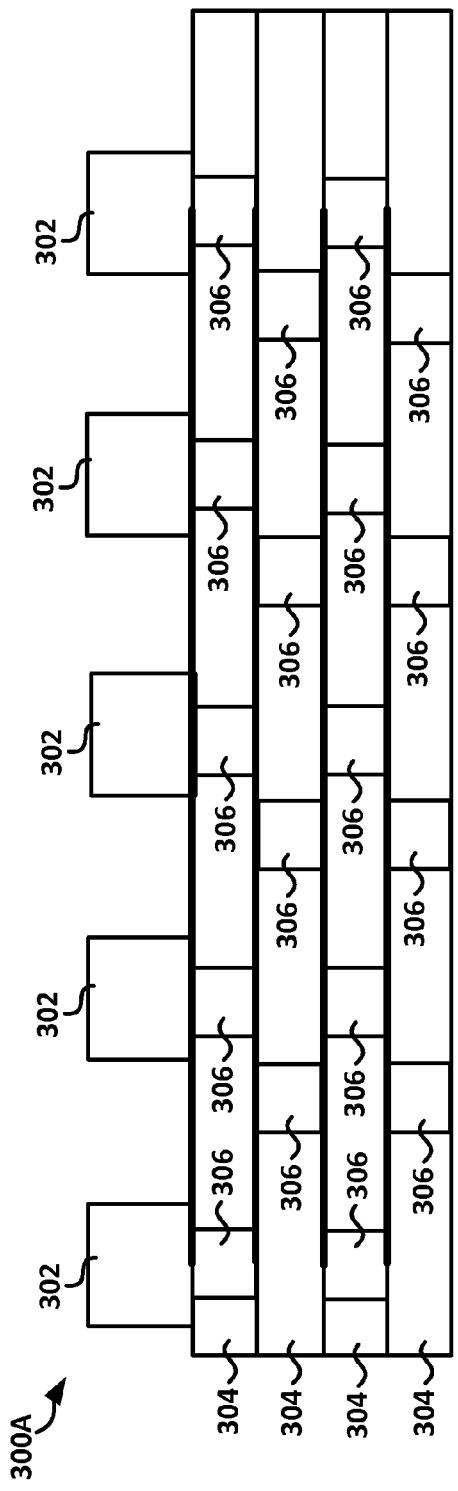

FIG. 3A shows a block diagram of an example of a flexible electronic circuit 300A according to one or more embodiments. The circuit 300A can include a plurality of die sections 302 on one or more layers of flexible material 304.

Each die section 302 can include circuitry configured to implement at least a portion of the functionality of a portion of a singular SoC (e.g., a die). The combination of the die sections 302 can implement the functionality of the SoC. The die section 302 can include silicon or other semiconductor, metal, or other circuit material. The die section 302 is not to be confused with a package that includes the die and a protective housing.

The flexible material 304 can include PDMS, PET, Polyimide PI, or other flexible material. The flexible material 304 can include one or more interconnects 308 (e.g., a trace, pad, or male or female connection feature) patterned thereon. The interconnects 308 can be meandering or otherwise configured to withstand flexion without breaking or cracking. The interconnects 308 can be situated between layers of the flexible material 304. The interconnects 308 can be patterned using lithography, such as micro-contact printing, or other method of forming interconnects. The interconnects 308 of one layer of flexible material 304 can be electrically or mechanically connected to an interconnect or die section 302, such as on another layer of flexible material, through one or more vias 306. The vias 306 can be formed using lithography, such as by spin coating conductive polymer. The vias 306 can be formed by developing photoresist in a specified pattern on the flexible material 304. The photoresist can be removed after development.

Figure 3B:
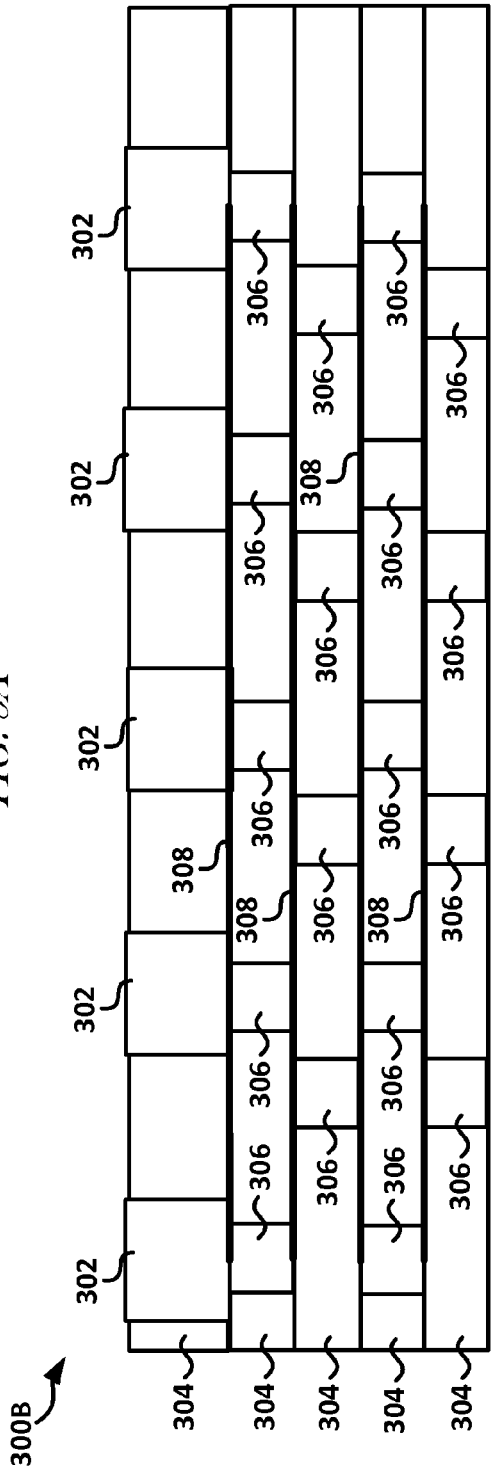
Figure 3C:
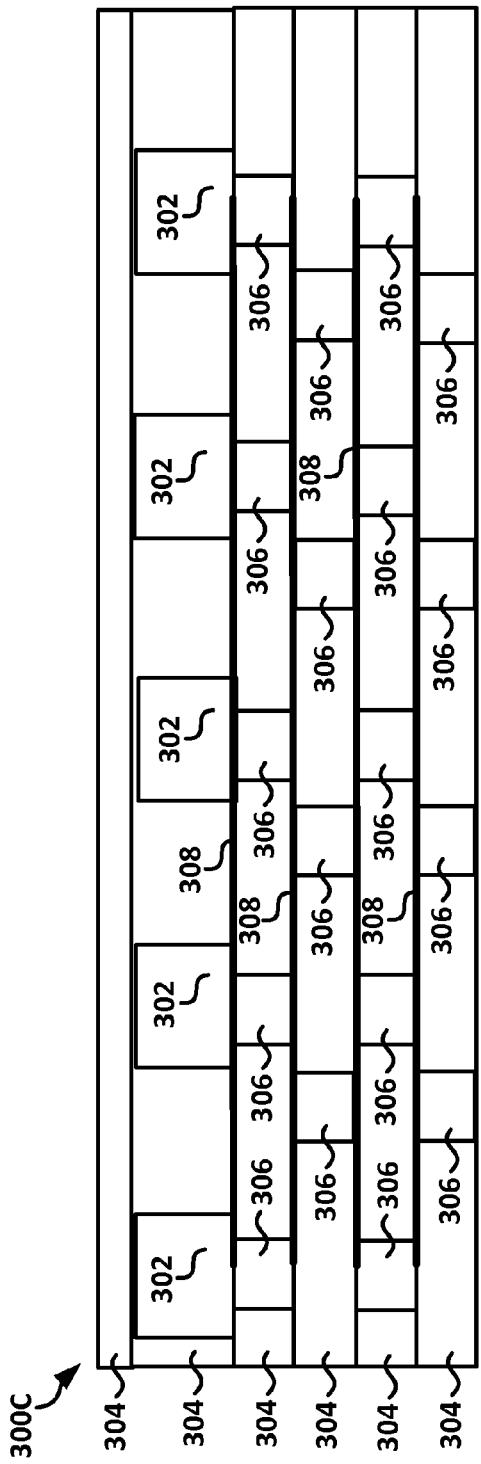

One or more die sections 302 can be exposed, such as shown in FIG. 3A. One or more die sections 302 can be at least partially immersed in the flexible material 304, such as shown in FIG. 3B. The circuit 300B can include a plurality of die sections 302 at least partially immersed in the flexible material 304. A face of a die section 302 can be exposed, such as shown in FIG. 3B. The circuit 300C can include a plurality of die sections 302 completely immersed in the flexible material 304, such as shown in FIG. 3C.

Figure 3D:
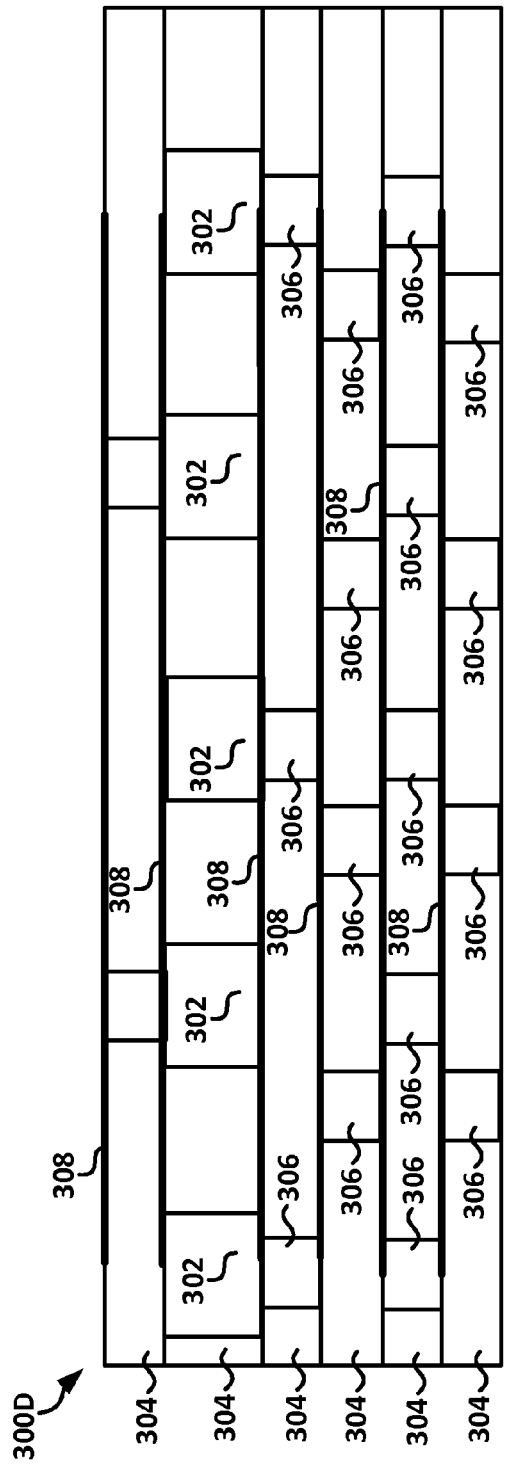

The circuit 300D, as shown in FIG. 3D, can include a die section 302 that is aligned in a direction that is opposite the direction of another die section (i.e. a functional side of the die section 302 need not always be facing the same direction as another die section). The functional side of the die section 302 can be the side with the pin out or interconnects through which access to the functionality or components of the die section is provided. A die section 302 that is aligned in a direction that is opposite the direction of another die can be considered reversed.

The flexible circuit 300E can include die sections 302 situated in multiple different layers of flexible material, such as shown in FIG. 3E. The flexible circuit 300F can include die sections 302 situated in multiple different layers of flexible material and at least one of the die sections 302 can be reversed (i.e. can have its functional side facing another direction) relative to another die section, such as shown in FIG. 3F.

The flexible substrate of FIGS. 3A-3F have a different physical appearance from traditional packages. There is no rigid substrate; instead there are one or more die sections on top of or embedded in flexible material (e.g., a transparent PDMS). PDMS is a transparent polymer which is flexible and compliant.

The flexible circuits of the FIGS. are not confined to be planar or rigid. These flexible devices can be incorporated into designs with curved surfaces, compliant surfaces, fabrics, or skin (e.g., as a sensor, radio, or other transducer) which can be difficult if not impossible using conventional rigid packages. The flexibility allows for a wide variety of options in product design.

Figure 4:
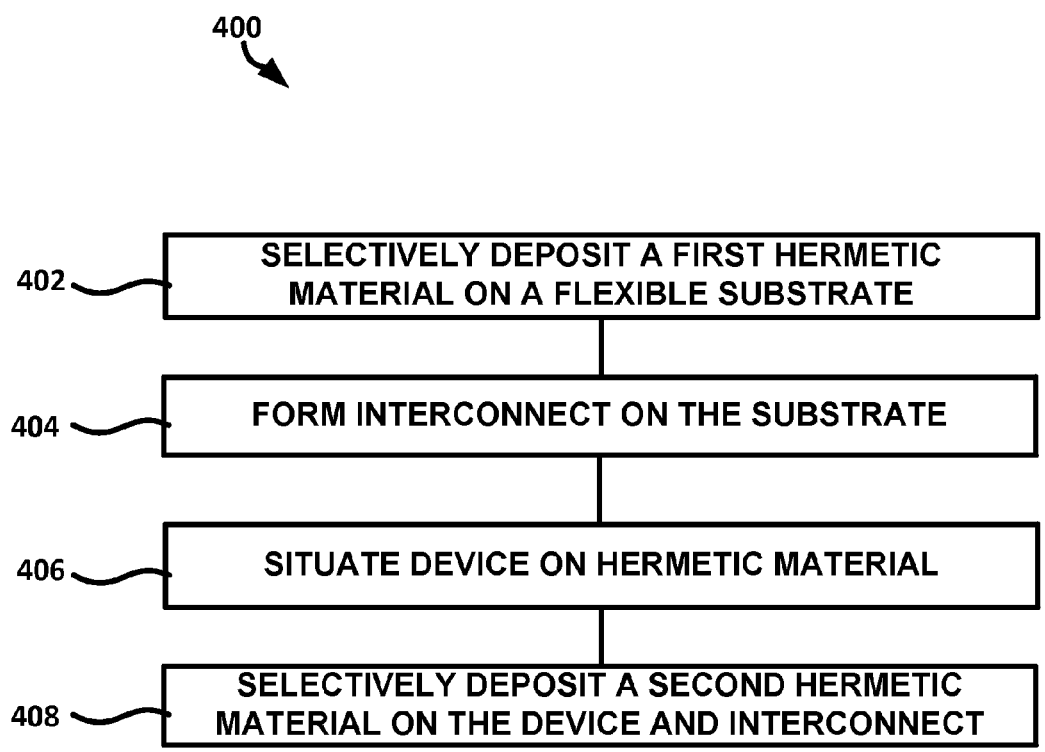
FIG. 4 shows an example of a technique for creating a hermetic seal on a flexible substrate.

FIG. 4 shows a flow diagram of an example of a technique 400 for making a hermetic seal on a flexible substrate according to one or more embodiments. At 402, a first hermetic material can be selectively deposited on a flexible substrate. At 404, an interconnect can be formed on the flexible substrate. The interconnect can be formed such that a portion of the interconnect overlaps with the hermitic material. At 406, a device can be situated on the hermetic material.

At 408, a second hermetic material can be selectively deposited on the device and interconnect. The second hermetic material can be deposited so as to hermetically seal the device within the combination of the interconnect and first and second hermetic materials. The technique 400 can include removing moisture from an exposed surface of the flexible substrate, device, or interconnect before depositing the second hermetic material. The technique 400 can include bombarding the flexible substrate, device, or interconnect with ions before or while depositing the second hermetic material.

The first and second hermetic materials can include glass. The first or second hermetic material can be deposited such that the layer of hermetic material is between about one and ten microns thick. The first or second hermetic material can be deposited at a temperature that is less than about one hundred degrees Celsius. Selectively depositing the first or second hermetic material can include situating photoresist on the flexible substrate, device, interconnect, or first hermetic material, depositing the first or second hermetic material on the photoresist, device, interconnect, first hermetic material, or the flexible substrate, and removing photoresist so as to remove a portion of the deposited first or second hermetic material. The first and second hermetic material can include the same or different materials.

The technique 400 can include forming a dielectric layer over the second hermetic material. Selectively depositing a first hermetic material on the flexible substrate can include depositing the first hermetic material on first and second opposing surfaces of the flexible substrate. Forming an interconnect on the flexible substrate can include forming an interconnect on each of the first and second sides of the flexible substrate. Situating a device on the first hermetic material can include situating a respective device on the first hermetic material on each of the first and second sides of the flexible substrate. Depositing a second hermetic material can include depositing a second hermetic material on the respective device on each of the first and second sides of the flexible substrate.

EXAMPLES AND NOTES

The present subject matter may be described by way of several examples.

Example 1 can include or use subject matter (such as an apparatus, a method, a means for performing acts, or a device readable memory including instructions that, when performed by the device, can cause the device to perform acts), such as can include or use (1) forming an interconnect on a flexible substrate, (2) situating a device on the substrate near the interconnect, or (3) selectively depositing a first hermetic material on the device and interconnect so as to hermetically seal the device within the combination of the interconnect and first hermetic material.

Example 2 can include or use, or can optionally be combined with the subject matter of Example 1 to include or use selectively depositing a second hermetic material on the flexible substrate before forming the interconnect, or wherein the interconnect can be formed such that a portion of the interconnect overlaps the second hermitic material.

Example 3 can include or use, or can optionally be combined with the subject matter of Example 2 to include or use, wherein selectively depositing the first hermetic material includes selectively depositing glass on the flexible substrate and wherein selectively depositing the second hermetic material on the device and interconnect includes selectively depositing glass on the device and the interconnect.

Example 4 can include or use, or can optionally be combined with the subject matter of at least one of Examples 2-3 to include or use, wherein selectively depositing the first hermetic material includes situating photoresist on the flexible substrate, depositing the first hermetic material on the photoresist and the flexible substrate, and removing photoresist so as to remove a portion of the deposited first hermetic material.

Example 5 can include or use, or can optionally be combined with the subject matter of at least one of Examples 2-4, to include or use forming a dielectric layer over the second hermetic material.

Example 6 can include or use, or can optionally be combined with the subject matter of at least one of Examples 2-5, to include or use removing moisture from an exposed surface of the flexible substrate, device, or interconnect before depositing the second hermetic material.

Example 7 can include or use, or can optionally be combined with the subject matter of at least one of Examples 2-6, to include or use bombarding the flexible substrate, device, first hermetic material, or interconnect with ions before or during depositing the second hermetic material.

Example 8 can include or use, or can optionally be combined with the subject matter of at least one of Examples 2-7 to include or use, wherein depositing the first or second hermetic material includes depositing the first or second hermetic material such that the layer of hermetic material is less than about ten microns thick.

Example 9 can include or use, or can optionally be combined with the subject matter of at least one of Examples 2-8 to include or use, wherein depositing the first or second hermetic material includes depositing the first or second hermetic material at a temperature that is less about one hundred degrees Celsius.

Example 10 can include or use, or can optionally be combined with the subject matter of at least one of Examples 2-9 to include or use, wherein (1) selectively depositing a first hermetic material on the flexible substrate includes depositing the first hermetic material on first and second opposing surfaces of the flexible substrate, (2) forming an interconnect on the flexible substrate includes forming an interconnect on each of the first and second sides of the flexible substrate, (3) situating a device on the first hermetic material includes situating a respective device on the first hermetic material on each of the first and second sides of the flexible substrate, or (4) depositing a second hermetic material includes depositing a second hermetic material on the respective device on each of the first and second sides of the flexible substrate.

Example 11 can include or use subject matter (such as an apparatus, a method, a means for performing acts, or a device readable memory including instructions that, when performed by the device, can cause the device to perform acts), such as can include or use (1) a glass island on a flexible substrate, (2) an interconnect on the flexible substrate and partially overlapping the glass island, (3) a device situated on the glass island and electrically coupled to the interconnect, or (4) a layer of glass over the device and at least partially over the interconnect, such that the layer of glass, the glass island, and the interconnect form a hermetic seal for the device.

Example 12 can include or use, or can optionally be combined with the subject matter of Example 11, to include or use a dielectric layer over the layer of glass.

Example 13 can include or use, or can optionally be combined with the subject matter of at least one of Examples 11-12, to include or use, wherein the island of glass is less than about ten microns thick.

Example 14 can include or use, or can optionally be combined with the subject matter of at least one of Examples 11-13, to include or use, wherein the glass island is a first glass island on a first surface of the substrate, the interconnect is a first metal contact on the first surface of the substrate, the device is a first device on the first surface of the substrate, and the layer of glass is a first layer of glass, and the Example 14 further includes (1) a second glass island on a second surface of the substrate, the second surface opposite the first surface, (2) a second interconnect on the second surface partially overlapping the second glass island, (3) a second device situated on the second glass island and electrically coupled to second, or (4) a second layer of glass over the second device and at least partially over the second interconnect, such that the second layer of glass, the second glass island, and the second interconnect hermetically seal the second device.

Example 15 can include or use, or can optionally be combined with the subject matter of at least one of Examples 11-14, to include or use an adhesive between and coupling the device to the glass island.

Example 16 can include or use, or can optionally be combined with the subject matter of at least one of Examples 11-15, to include or use, wherein the flexible substrate includes Polydimethylsiloxane (PDMS).

Example 17 can include or use subject matter (such as an apparatus, a method, a means for performing acts, or a device readable memory including instructions that, when performed by the device, can cause the device to perform acts), such as can include or use (1) a plurality of stacked flexible substrate layers including a first substrate layer on a second substrate layer, (2) first and second die sections situated in the stacked flexible substrate layers, or (3) a first interconnect circuit patterned on a surface of the second substrate layer proximate the first substrate layer, wherein the first and second die sections are electrically coupled through the interconnect circuit.

Example 18 can include or use, or can optionally be combined with the subject matter of Example 17, to include or use, wherein the plurality of stacked flexible substrate layers further include a third substrate layer, wherein the second substrate layer is on the first substrate layer, or the Example 18 further includes a second interconnect circuit patterned on a surface of the third substrate layer proximate the second substrate layer, or a via through the second substrate layer, wherein the via electrically couples the first interconnect circuit to the second interconnect circuit.

Example 19 can include or use, or can optionally be combined with the subject matter of at least one of Examples 17-18, to include or use, wherein the plurality of stacked flexible substrate layers further include a fourth substrate layer situated on the first substrate layer, wherein the first die section includes a first active side facing an opposite direction as a second active side of the second die, or the Example 19 further includes a third interconnect circuit patterned on a surface of the first substrate layer proximate the four substrate layer.

Example 20 can include or use, or can optionally be combined with the subject matter of at least one of Examples 17-19, to include or use, wherein the plurality of stacked flexible substrate layers include Polydimethylsiloxane (PDMS).

Example 21 can include or use, or can optionally be combined with the subject matter of at least one of Examples 17-20, to include or use, wherein the first die section is hermetically sealed using a combination of an interconnect of the first interconnect circuit, a hermetic material situated under the first die section, and a hermetic material over the first die section and at least partially over the interconnect.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:
1. An apparatus comprising:
a first glass island on a first surface of a flexible substrate;
a first metal contact including a first portion in contact with the flexible substrate and a second portion on a first side of the first glass island and on a surface of the first glass island;
a second metal contact including a first portion on the flexible substrate and a second portion on a second side of the first glass island and on the surface of the first glass island, the second side of the first glass island opposite the first side of the first glass island;
a first device situated on the first glass island and electrically coupled, using wire bonds, to the first and second metal contacts;
a first layer of glass over the first device and in contact with the first and second metal contacts, such that the first layer of glass, the first glass island, and the first and second metal contacts form a hermetic seal for the first device;
a second glass island on a second surface of the flexible substrate, the second surface opposite the first surface;
a third metal contact including a first portion on the second surface and including a second portion on the second glass island;
a fourth metal contact completely on the second glass island;

a second device situated on the second glass island and electrically coupled, using a flip chip interconnect, to the third metal contact near a first side of the second device; and a second layer of glass in contact with the second glass island so as to form a continuous glass structure, the second layer of glass covering a second side of the second device, covering a surface of the second device facing away from the second glass island, and covering the first side of the second device, the second side of the second device opposite the first side of the second device, the second layer of glass in contact with the third metal contact, such that the glass structure, and the third metal contact hermetically seal the second device.

2. The apparatus of claim 1, further comprising:
a dielectric layer over the first layer of glass.

3. The apparatus of claim 1, wherein the first glass island is less than about ten microns thick.

4. The apparatus of claim 1, further comprising an adhesive between and coupling the first device to the first glass island.

5. The apparatus of claim 1, wherein the flexible substrate includes Polydimethylsiloxane (PDMS).

* * * * *